| (12) | United States Patent | (10) Patent No.: | US 9,160,286 B2 |
|---|---|---|---|
| | Kalantari et al. | (45) Date of Patent: | Oct. 13, 2015 |

(54) RADIO FREQUENCY POWER AMPLIFIERS

(71) Applicant: The Regents of the University of California, Oakland, CA (US)

(72) Inventors: Nader Kalantari, Laguna Niguel, CA (US); James Buckwalter, San Clemente, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 14/356,677

(22) PCT Filed: Nov. 9, 2012

(86) PCT No.: PCT/US2012/064484
§ 371 (c)(1),
(2) Date: May 7, 2014

(87) PCT Pub. No.: WO2013/071133
PCT Pub. Date: May 16, 2013

(65) Prior Publication Data
US 2014/0320212 A1 Oct. 30, 2014

Related U.S. Application Data

(60) Provisional application No. 61/557,866, filed on Nov. 9, 2011.

(51) Int. Cl.
*H03F 3/19* (2006.01)
*H03F 3/21* (2006.01)
*H03F 1/34* (2006.01)

(52) U.S. Cl.
CPC .. *H03F 3/19* (2013.01); *H03F 1/34* (2013.01); *H03F 3/21* (2013.01); *H03F 2200/138* (2013.01); *H03F 2200/451* (2013.01)

(58) Field of Classification Search
USPC .................... 330/294, 107, 109, 282, 279, 86
See application file for complete search history.

(56) References Cited

U.S. PATENT DOCUMENTS

| 8,456,237 B2 * | 6/2013 | Huang et al. .................. 330/282 |
|---|---|---|
| 2009/0231042 A1 | 9/2009 | Jia et al. |
| 2011/0163804 A1 | 7/2011 | Li |

OTHER PUBLICATIONS

K.B.N., et al., "Nois in Broad-Band GaAs MESFET Amplifiers with Parallel Feedback", IEEE Transactions on Microwave Theory and Techniques, vol. MTT-30, No. 1, pp. 63-70, Jan. 1982.

(Continued)

*Primary Examiner* — Hieu Nguyen
(74) *Attorney, Agent, or Firm* — Mintz Levin Cohn Ferris Glovsky and Popeo, P.C.

(57) ABSTRACT

A radio frequency power amplifier amplifies an input signal at an input port, and produces an output signal at an output port. The power amplifier may include one or more amplifier stages. An amplifier stage may include an active device, and a feedback network. The feedback network may include one or more reactive elements configured to resonate at a predetermined frequency, to provide an impedance match at the input to the amplifier stage, and to provide an impedance match at the output of the amplifier stage. In some example implementations, the input and output impedance matching is caused by biasing the active device to produce a transconductance at least one of equal to or greater than a critical transconductance.

14 Claims, 7 Drawing Sheets

(56) References Cited

OTHER PUBLICATIONS

K.B.N., et al., "The Matched Feedback Amplifier: Ultrawife-Band Microwave Amplification with FaAs MESFET's", IEEE Transactions on Microwave Theory and Techniques, vol. MIT-28, No. 4, pp. 285-294, Apr. 1980.

PCT International Search Report dated Mar. 12, 2013, for PCT application No. PCT/US2012/064484.
Kalantari, et al., "A Nested Reactive Feedback Power Amplifier for Q-band Operation", IEEE Transactions on Microwave Theory and Techniques, vol. X, No. X, 2011.

* cited by examiner

Small signal model

RADIO FREQUENCY POWER AMPLIFIERS

CROSS-REFERENCE TO RELATED APPLICATIONS

This application is a national stage application, filed under 35 U.S.C. §371, of PCT Application No. PCT/US2012/064484, filed on Nov. 9, 2012, which claims the benefit of priority to U.S. Provisional Patent application Ser. No. 61/557,866, filed on Nov. 9, 2011, and entitled "RADIO FREQUENCY POWER AMPLIFIERS". The contents of both applications are incorporated herein by reference in their entirety for all purposes.

STATEMENT OF GOVERNMENT SPONSORED SUPPORT

Certain aspects of the subject matter described herein were developed with U.S. Government support under Grant No. W911NF-10-1-0089 awarded by ARMY-ARO. The U.S. Government has certain rights in the invention.

TECHNICAL FIELD

The subject matter described herein relates to radio frequency power amplifiers.

BACKGROUND

Many radio frequency applications including automotive radar systems, terrestrial wireless communications, and satellite communications require radio frequency power amplifiers. Some applications requiring power amplifiers operate at millimeter-wave frequencies. At high frequencies including millimeter-wave frequencies, designing and producing power amplifiers with high output power and high efficiency is challenging. Some other challenges include input impedance matching to a source impedance, and output impedance matching to a load impedance. These challenges are due in part to the deleterious effects of unavoidable parasitic elements of the active devices used to create amplification. For example, the parasitic base-collector capacitance and the parasitic base-emitter capacitance can degrade the input and output matching, amplifier efficiency, and output power.

SUMMARY

Methods and apparatus, including computer program products, are provided for a circuit and a circuit model of a radio frequency power amplifier providing high power output, high efficiency, and good input and output matching at radio frequencies including millimeter-wave frequencies.

In some example embodiments, an apparatus is provided. The apparatus may include a first transmission line carrying a signal to an input port of a power amplifier, the power amplifier producing an output signal at an output port of the power amplifier. The power amplifier may include one or more power amplifier stages. A power amplifier stage may include an active device, and a feedback network comprising one or more reactive elements configured to resonate at a predetermined frequency. The feedback network may also be configured to provide a impedance matching at an input to the amplifier stage, and to provide impedance matching at an output of the amplifier stage, the input impedance matching and the output impedance matching configured by at least biasing the active device to produce a transconductance at least one of equal to or greater than a critical transconductance.

In some example embodiments, one of more variations may be made as well as described in the detailed description below and/or as described in the following features. The critical transconductance may be determined based on the equation: $g_{m,crit} = C_i / C_{eff} Z_o$ wherein Ci is an input capacitance, Ceff is an effective capacitance, and Zo is a characteristic impedance. The one or more active devices may include a bipolar junction transistor, a field effect transistor, a metal oxide semiconductor field effect transistor, a metal semiconductor field effect transistor, and a high electron mobility transistor.

In some example embodiments, a method may be provided. The method may include determining a bias point for an active device in a radio frequency power amplifier, wherein the bias point is selected to cause a transconductance of the active device to be above a critical transconductance value; determining a parasitic capacitance between an input of the active device and an output of the active device; selecting one or more reactive components in a feedback circuit of the radio frequency power amplifier to produce a parallel tank circuit, the one or more reactive components including the parasitic capacitance; and determining one or more values for the one or more reactive components in the parallel tank circuit to cause an input impedance match and an output impedance match.

In some example embodiments, one of more variations may be made as well as described in the detailed description below and/or as described in the following features. The feedback network may include an inductor connected between an input port and an output port, an input capacitor connected between the input port and the base of the transistor, a parasitic capacitance of the transistor between the base of the transistor and the collector of the transistor, and an output capacitor connected between the output port and the collector of the transistor. The feedback network may include a feedback capacitor in parallel with the parasitic base-collector capacitance of the transistor, and/or a parasitic capacitance of the transistor between the base of the transistor and the emitter of the transistor.

It is to be understood that both the foregoing general description and the following detailed description are exemplary and explanatory only and are not restrictive. Further features and/or variations may be provided in addition to those set forth herein. For example, the implementations described herein may be directed to various combinations and subcombinations of the disclosed features and/or combinations and subcombinations of several further features disclosed below in the detailed description.

DESCRIPTION OF DRAWINGS

The accompanying drawings, which are incorporated in and constitute a part of this specification, show certain aspects of the subject matter disclosed herein and, together with the description, help explain some of the principles associated with the disclosed implementations. In the drawings.

When practical, similar reference numbers denote similar structures, features, or elements.

DETAILED DESCRIPTION

Figure 1:
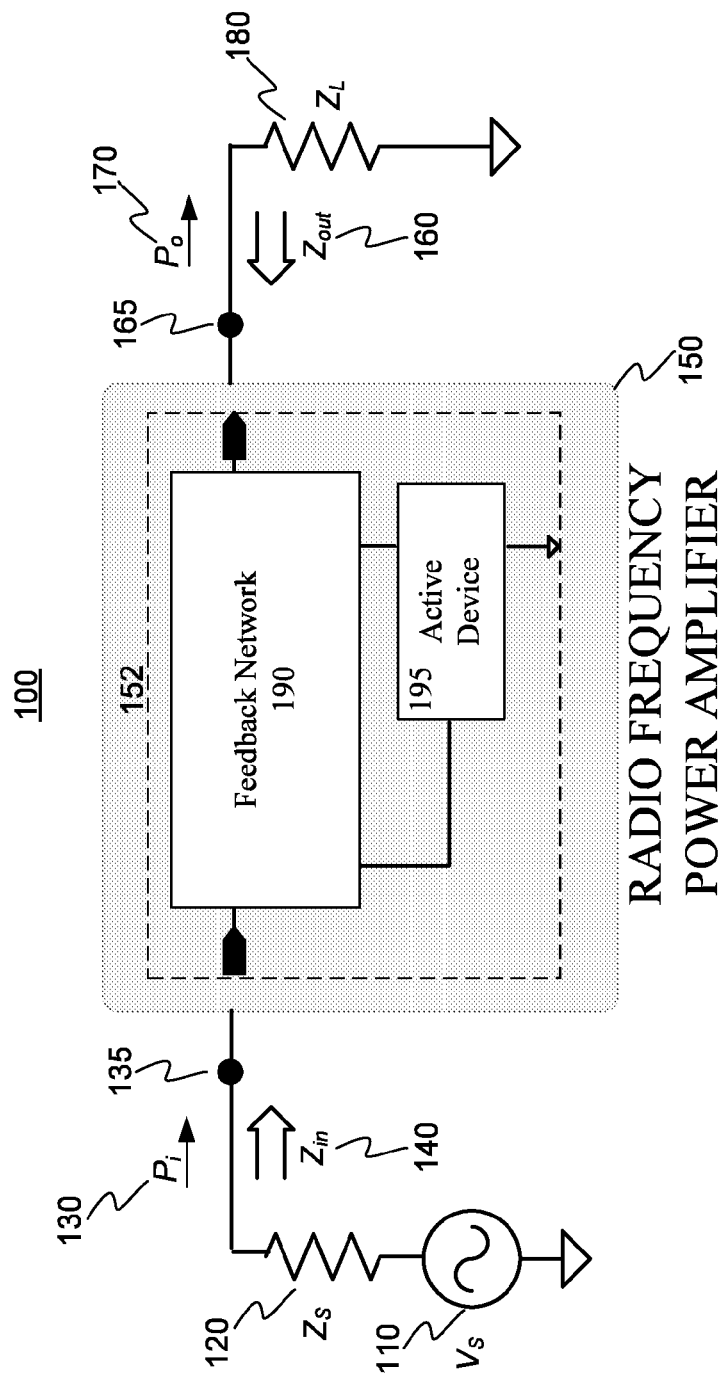
FIG. 1 is a diagram showing a source, a load, and an example of a power amplifier, in accordance with some implementations.

FIG. 1 depicts an example of a radio frequency power amplifier 150 including a radio frequency (RF) source 110 having a source impedance $Z_s$ 120, a feedback network 190, an active device 195, and a load 180 having a load impedance $Z_L$ 180, in accordance with some example implementations. The RF source 110 may have an input power $P_i$ 130 available to supply to RF power amplifier 150 at input port 135. In the example of FIG. 1, the RF source 110 may provide a radio frequency carrier that is modulated to carry information. In some example implementations, the RF source 110 may generate a RF carrier having a frequency between 5 GHz and 150 GHz including the millimeter-wave bands, such as Q-band (30-50 GHz), V-band (50-75 GHz), and W-band (75-110 GHz), although other frequency ranges may be used as well. The radio frequency amplifier 150 may also include an input impedance $Z_{in}$ 140 (e.g., in ohms), an output power $P_o$ 170 delivered at output port 165 to load impedance $Z_L$ 180, and an output impedance $Z_{out}$ 160 (e.g., in ohms). RF power amplifier 150 amplifies input power $P_i$ 130 and delivers output power $P_o$ to load impedance $Z_L$ 180.

In some example implementations, RF power amplifier circuit 100 may be configured, such that a source impedance, an input impedance, an output impedance, and a load impedance are each determined so as to substantially match an impedance value (referred to herein as a characteristic impedance). For example, source impedance $Z_s$ 120 and load impedance $Z_L$ 180 may each be selected to have a value equal to about a characteristic impedance, $Z_o$. Moreover, RF power amplifier 150 may be configured so that active device 195 and feedback network 190 are selected to provide input impedance $Z_{in}$ 140 equal to about the characteristic impedance and output impedance $Z_{out}$ 160 equal to about the characteristic impedance. In some example implementations, the characteristic impedance may be equal to about 50 ohms, although other impedance values may be used as well.

In some example implementations, the feedback network 190 combined with the active device 195 may be configured to nullify the deleterious effects of the parasitic elements of active device 195 in order to provide higher output power, greater amplifier efficiency, and/or provide good input and output matching. The combination of the input impedance $Z_{in}$ 140 and the source impedance $Z_s$ 120 may determine a reflection coefficient (related to as the Scattering parameter $S_{11}$, when the input port 135 is port 1). When the reflection coefficient is about equal to zero or nearly zero (e.g., less than or equal to about 0.1 or equivalently −10 dB), the impedances, such as source impedance $Z_s$ 120 and RF power amplifier input impedance $Z_{in}$, may be considered well matched.

In some example implementations, the parasitic elements of one or more active devices, such as active device 195, may be combined with external components, such as for example inductors and capacitors selected to form a tank circuit resonant at a predetermined frequency. The tank circuit may include parasitic components of the active device 195, such as a parasitic base-collector capacitance, $C_\mu$, if the active device is a bipolar junction transistor. When an active device 195 is biased so that the transconductance of the active device 195 is above a certain value, such as for example a critical value, then at, or near, the resonant frequency of the tank circuit, the RF power amplifier 150 may, in some example implementations, achieve a higher output power before going into gain compression, when compared to an active device without the parallel tank circuit. Transconductance values above the critical value may also provide higher output power before going into compression. However, selecting a transconductance value below the critical value may result in poorer input and output matching and degraded linearity and output compression at a lower output power compared to the matching and linearity when the transconductance is above the critical value. Along with the increased output power, the feedback network 190 and the active device 195 may also cause an impedance match at the input port 135 between the input impedance $Z_{in}$ 140 and source impedance $Z_s$ 120. And, the feedback network 190 and the active device 195 having a transconductance at, or above, the threshold value may cause an impedance match at the output port 165 between the output impedance $Z_{out}$ 160 and load impedance $Z_L$ 180.

In some example implementations, the RF amplifier 150 may include one or more active devices and one or more passive devices. Examples of active devices include a bipolar junction transistor (BJT), a heterojunction bipolar transistor (HBT), a field effect transistor (FET), a metal oxide semiconductor field effect transistor (MOSFET), a metal semiconductor field effect transistor (MESFET), and a high electron mobility transistor (HEMT), although other active devices may be included in RF amplifier 150 as well. In some example implementations, the active device 195 is chosen to be a bipolar junction transistor produced in a 120 nm silicon-germanium (SiGe) BiCMOS process, although other processes may be used as well. Examples of passive devices include an inductor, a capacitor, and a transmission line, although other types of passive devices may be included in RF power amplifier 150 as well. Moreover, the devices used in the power amplifier 150 may be implemented in a semiconductor processes, such as for example silicon (Si), silicon germanium (SiGe), gallium arsenide (GaAs), indium phosphide (INP), gallium nitride (GaN) as well as others. In some example implementations, the semiconductor process may allow for multiple active device types, such as in a bipolar/complementary metal oxide semiconductor (BiCMOS) process that allows for biploar transistors and complementary metal oxide semiconductor (CMOS) devices to be produced using the same process.

RF power amplifier 150 may include a single amplification stage, such as amplifier stage 152 or multiple amplifier stages. Multiple amplifier stages may be cascaded with the input port 135 connected to the input to the first stage and the output of the first stage being connected to the input of the next stage, and so on, up to the last stage where the output of the last stage is connected to output port 165. Multiple amplifier stages may also be interconnected in parallel where the outputs of multiple stages are combined together at output port 165. A combination of cascaded amplifier stages and parallel amplifier stages may also be used.

Figures 2A, 2B:
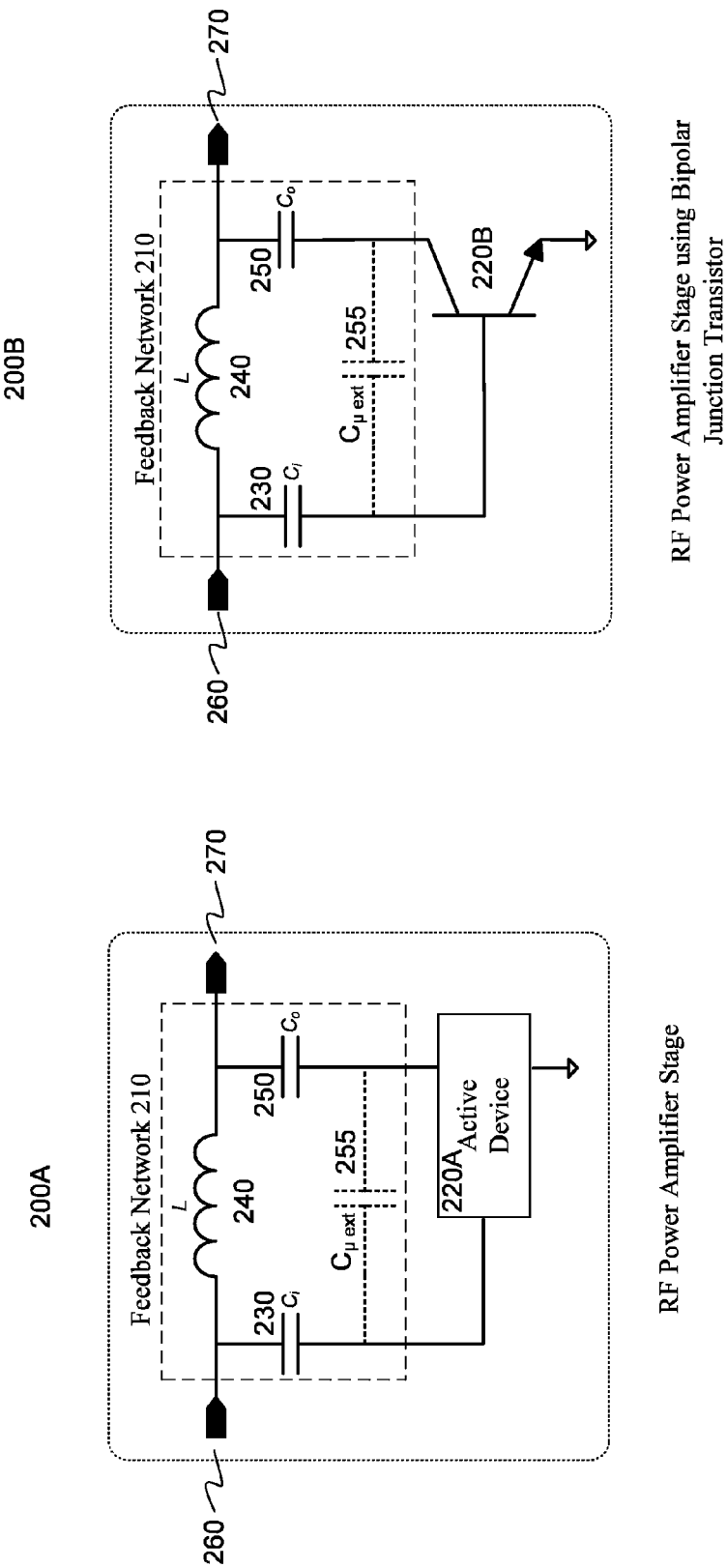
FIG. 2A depicts a diagram showing an example of a single stage radio frequency (RF) power amplifier incorporating an active device, in accordance with some implementations.
FIG. 2B depicts a diagram showing an example of a single stage RF power amplifier incorporating a bipolar junction transistor as the active device, in accordance with some implementations.

FIG. 2A depicts an example of a single RF power amplifier stage 200A. The RF power amplifier single stage 200A may include an input port 260 for receiving a signal for amplification, a feedback network 210, an active device 220A, and an output port 270 for supplying an amplified output signal. In some example implementations, the active device 220A may be an active device configured in accordance with a semiconductor process as noted above (e.g., a bipolar junction transistor implemented in a BiCMOS process, and the like). The feedback network 210 may include an input capacitor $C_i$ 230, an inductor L 240, an output capacitor $C_o$ 250, and feedback capacitor $C_{\mu\,est}$ 255.

In stage 200A, input capacitor $C_i$ 230 may connect input port 260 to the gate/base/input of active device 220A, inductor L 240 may connect input port 260 to output port 270, output capacitor $C_o$ 250 may connect output port 270 to the drain/collector/output of active device 220A, and feedback capacitor $C_{\mu\,ext}$ 255 may connect the input port 260 to the output port 270. The source/emitter of active device 200A may be connected to a ground (e.g., an alternating current (AC) ground).

FIG. 2B depicts an example of a single RF power amplifier stage 200B implemented using a bipolar junction transistor 220B. For example, in stage 200B, input capacitor $C_i$ 230 may connect input port 260 to the base of bipolar junction transistor 220B, inductor L 240 may connect input port 260 to output port 270, output capacitor $C_o$ 250 may connect output port 270 to the collector of bipolar junction transistor 220B, and feedback capacitor $C_{\mu\,ext}$ 255 may connect the input port 260 to the output port 270. The parasitic capacitance of bipolar junction transistor 220B, may also connect the input port 260 to the output port 270. The emitter of bipolar junction transistor 220B may be connected to AC ground. A parallel tank circuit may be formed from inductor L 240 in parallel with the series combination of input capacitance $C_i$ 230, output capacitance $C_o$ 250, and the parallel combination of parasitic base-collector capacitance $C_\mu$ of bipolar junction transistor 220B in parallel with feedback capacitance $C_{\mu\,ext}$ ext 255. In some example implementations, feedback capacitance $C_{\mu\,ext}$ 255 may have a zero or nearly zero capacitance value.

The parasitic base-collector capacitance $C_\mu$ of bipolar junction transistor 220B may be an equivalent value determined based on the configuration of bipolar junction transistor 220B and the process selected to fabricate bipolar junction transistor 220B. The value of parasitic base-collector capacitance $C_\mu$ may be determined based on the device physics, or measured.

Figure 3A:
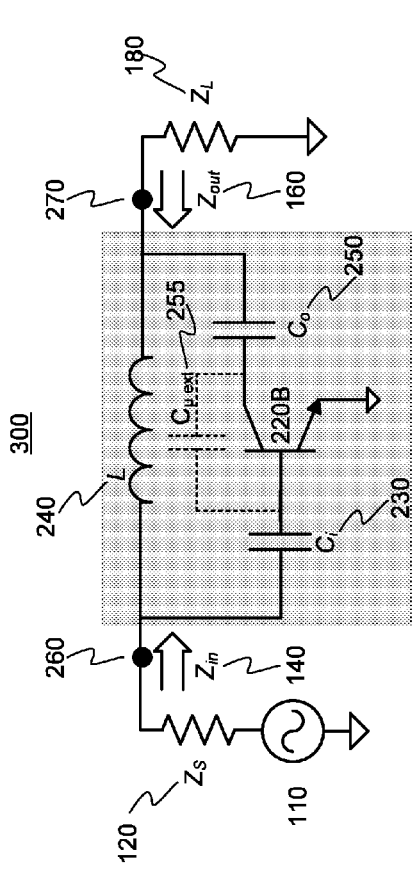
FIG. 3A shows an alternating circuit (AC) circuit diagram of a single stage RF power amplifier, in accordance with some implementations.

FIG. 3A depicts an example of a single stage RF power amplifier 300, which is similar in some respects to the power amplifier 200B in FIG. 2B. The amplifier 300 may include an input source 110 with a source impedance $Z_s$ 120 about equal to a characteristic impedance $Z_o$ and a load impedance 180 about equal to a characteristic impedance $Z_o$. For simplicity, FIG. 3A depicts an AC equivalent circuit without a bias network, although it may be presumed that the bipolar transistor 220B is biased to a transconductance above a critical transconductance.

Figure 3B:
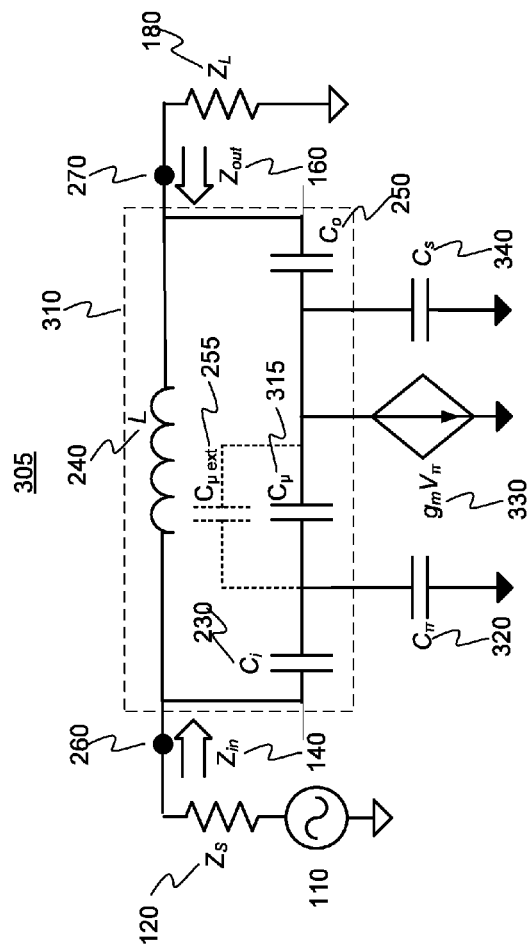
FIG. 3B shows a small-signal AC circuit model including a feedback network, in accordance with some implementations.

FIG. 3B depicts an example of a small-signal circuit model 305 representation of the single stage RF power amplifier 300 at FIG. 3A. The small-signal circuit model 305 may include the active device model parameters, such as parasitic base-collector capacitance $C_\mu$ 315, transconductance $g_m$ 330, substrate capacitance $C_s$ 340, and base-emitter capacitance $C_\pi$ 320. The parallel resonant tank circuit 310 may include a feedback network, such as feedback network 210 and the parasitic base-collector capacitance (or gate-drain capacitance) of the active device, such as base-collector capacitance $C_\mu$ 315.

When the active device transconductance, $g_m$, is selected to be greater than the critical transconductance (e.g., $g_m \geq g_{m,crit}$), the following device behavior may be observed:

$$\omega_o = 1/\sqrt{(LC_{eff})} \quad \text{Equation 1A,}$$

wherein $\omega_o$ is the resonant frequency of the parallel tank circuit,

L represents the inductance L 240 of the feedback network, and $C_{eff}$ represents the effective capacitance of the series combination of input capacitance $C_i$, output capacitance $C_o$, and the total base-collector capacitance ($C_\mu + C_{\mu\,ext}$).

And, $C_{eff}$ may be determined in accordance with the following:

$$C_{eff} = \frac{1}{\frac{1}{C_i} + \frac{1}{C_o} + \frac{1}{C_{\mu+C_{\mu ext}}}}. \quad \text{Equation 1B}$$

In some representations, the sum of $C_\mu$ and $C_{\mu\,ext}$ is referred to as just $C_\mu$.

And, the voltage gain, $A_v$, represents the voltage gain of the power amplifier, wherein $A_v$ may be determined in accordance with the following:

$$A_v = C_i/C_\mu \quad \text{Equation 1C.}$$

At the resonant frequency, $\omega_o$, of the parallel tank circuit 310, the transconductance 330 of the active device 220B and the parallel tank circuit 310 may cause the input impedance $Z_{in}$ 140 to be about equal to the characteristic impedance $Z_o$ and may cause the output impedance $Z_{out}$ 160 to be about equal to characteristic impedance $Z_o$.

With the input port 260 as port 1 and the output port 270 as port 2, the two-port S-parameters of the small-signal circuit model shown in FIG. 3B are as follows:

$$S_{11} = S_{22} = \frac{-\alpha s^3 + (\beta - LC_i)s^2 + \left(-\gamma + \frac{L}{Z_o}\right)s}{\alpha s^3 + \beta s^2 + \gamma s + 1}, \quad \text{Equation 2A}$$

$$S_{21} = \frac{1 - L\frac{C_i^2}{C_\mu}s^2}{1 + LC_i s^2} \cdot \frac{(2\beta - LC_i)s^2 + \frac{L}{Z_o}s + 1}{\alpha s^3 + \beta s^3 + \gamma s + 1}, \quad \text{Equation 2B}$$

$$S_{12} = \frac{1}{1 + LC_i s^2} \cdot \frac{(2\beta - LC_i)s^2 + \frac{L}{Z_o}s + 1}{\alpha s^3 + \beta s^2 + \gamma s + 1}, \quad \text{Equation 2C}$$

wherein $\alpha = (LC_i^2 Z_o)/(2)$, $\beta = (LC_i^2)/(2C_{eff}g_m Z_o) + LC_i$, and $\gamma = (C_i^2 Z_o)/(2C_{eff}) + (L)/(2Z_o)$ may determine the frequency dependency of the S-parameters.

The input and output return loss, $S_{11}$ and $S_{22}$, are expressed in Equation 3A. Instead of using separate input matching and output matching circuits, the tank circuit including feedback network 210 and active device 220A/B may be configured to provide both input and output matching.

$S_{11}$ and $S_{22}$ are minimized at a frequency, $\omega_{notch}$ expressed as follows:

$$\omega_{notch} = \sqrt{(1)/(C_{eff}L) - (1)/(C_iZ_o)^2} \quad \text{Equation 3.}$$

which is slightly below $\omega_o$. When the voltage gain is high, $$A_v = \frac{c_i}{c_\mu} \gg 1,$$

$\omega_{notch}$ approaches $\omega_o$.

For values of transconductance $g_m$ below the critical transconductance $g_{m,crit}$, at resonant frequency $\omega_o$, the input impedance is high compared to characteristic impedance $Z_o$, since β dominates both the numerator and denominator in Equation 2A. In this case, the parallel tank circuit 310 and transconductance 330 simplify to a parallel LC circuit which is an open circuit at resonant frequency $\omega_o$. For larger values of the transconductance $g_m$, the real part of the input (and output) impedance decreases and the input and output impedances converge to the following:

$$Z_{in}(\omega_o) = Z_o\left(1 + \frac{j\sqrt{C_{eff}L}}{Z_o(C_i - C_{eff})}\right) \quad \text{Equation 4}$$

$$\approx Z_o + \frac{j}{\omega_o C_i}, \text{ for } A_v \gg 1.$$

While the real part of the impedance approaches the characteristic impedance value $Z_o$, the imaginary part is inversely proportional to the input capacitance $C_i$. Thus, the input and output matching may, in some example implementations, improve as the input capacitance $C_i$ 230 becomes larger. The required transconductance $g_m$ for a return loss better than 10 dB may be defined as the critical transconductance as follows:

$$g_{m,crit} = \frac{C_i}{C_{eff}Z_o} \quad \text{Equation 5}$$

$$\approx \frac{A_v}{Z_o}, \text{ for } A_v \gg 1.$$

Increasing both the transconductance $g_m$ and the ratio of input capacitance to the base-collector capacitance (e.g., $C_i/C_\mu$) may, in some example implementations, improve the return loss. For an input-output capacitance ratio equal to about 2 (e.g., $C_i/C_\mu=2$), increasing the transconductance $g_m$ above the critical transconductance value $g_{m,crit}$ may not substantially improve (e.g., increase) the return loss.

From Equation 2B, the peak value of the gain, $S_{21}$, occurs at a frequency, such as $\omega_{peak}=\sqrt{(1)/C_{eff}L)+(1)/((C_iZ_o)^2)}$, when the denominator of Equation 2B is minimized. Because of the numerator in Equations 2B and 2C, the reverse voltage gain, $S_{12}$, is much smaller than the forward voltage gain $S_{21}$. As such, the isolation between the input port 135 and the output port 165 increases with the gain in some example implementations. For a transconductance much greater than the critical transconductance, Beta approaches the value of the product of the inductance L 240 and input capacitance $C_i$ 230 (e.g., $g_m \gg g_{m,crit}$, β→$LC_i$), simplifying the following equation $(2\beta-LC_i)s^2+(L)/(Z_o)s+1$ to $LC_is^2+(L)/(Z_o)s+1$, which yields a local minimum at a frequency $\omega=\sqrt{(1)/(LC_i)}$. Consequently, the pole at this frequency, $\omega=\sqrt{(1)/(LC_i)}$, from $1+LC_is^2$ is cancelled due to the following: $(2\beta-LC_i)s^2+(L)/(Z_o)s+1$.

The frequency where $S_{11}$ and $S_{22}$ are at a minimum (which is also referred to as a notch frequency, $\omega_{notch}$) and the frequency where $S_{21}$ peaks, $\omega_{peak}$, are related to the resonant frequency $\omega_o$ as follows:

$$\omega_{notch}^2 + \omega_{peak}^2 = \omega_o^2 \quad \text{Equation 6.}$$

For high input capacitance $C_i$ values, the notch frequency and peak frequency approach the resonant frequency $\omega_o$. At the resonant frequency, $\omega_o$, Equations 2B and 2C may be simplified as follows:

$$S_{21}(\omega_o) = \frac{C_i}{C_\mu}\left(1 + \frac{j}{-C_iZ_o\omega_o + \frac{Z_o}{L\omega_o}}\right), \text{ and} \quad \text{Equation 7A}$$

$$S_{12}(\omega_o) = \frac{C_{eff}}{C_i}\left(1 + \frac{j}{-C_iZ_o\omega_o + \frac{Z_o}{L\omega_o}}\right). \quad \text{Equation 7B}$$

The quality factor, Q, may be expressed as follows:

$$Q=(Z_o)/(\omega_o L)=(Z_o)/(\sqrt{(L)/(C_{eff})}) \quad \text{Equation 8.}$$

Since the quality factor Q of the of the parallel tank circuit in Equation 8 may be inversely proportional to the value of the inductor L 240, a smaller inductor value may make the parallel tank more narrowband, while a larger value may make the parallel tank more broadband. A smaller value of the effective capacitance $C_{eff}$ may make the parallel tank more wideband, while a larger capacitor value may make the parallel tank more narrowband. The return losses, $S_{11}$ and $S_{22}$, may be broadened using balanced architectures or staggering the return loss across multiple power amplifier stages.

The above disclosure is based on the base-emitter capacitance $C_\pi$ and the substrate capacitance $C_s$ being zero or about zero. Generally, the substrate capacitance $C_s$ may be relatively small and thus has minor effects. The base-emitter capacitance $C_\pi$ may be an order of magnitude larger than the input capacitance $C_i$ due to the value of the transconductance $g_m$. The base-emitter capacitance $C_\pi$ reduces the gain, $S_{21}$. However, this reduction in gain may have the beneficial effect of keeping the active device out of compression at higher output voltage swings.

Figure 4:
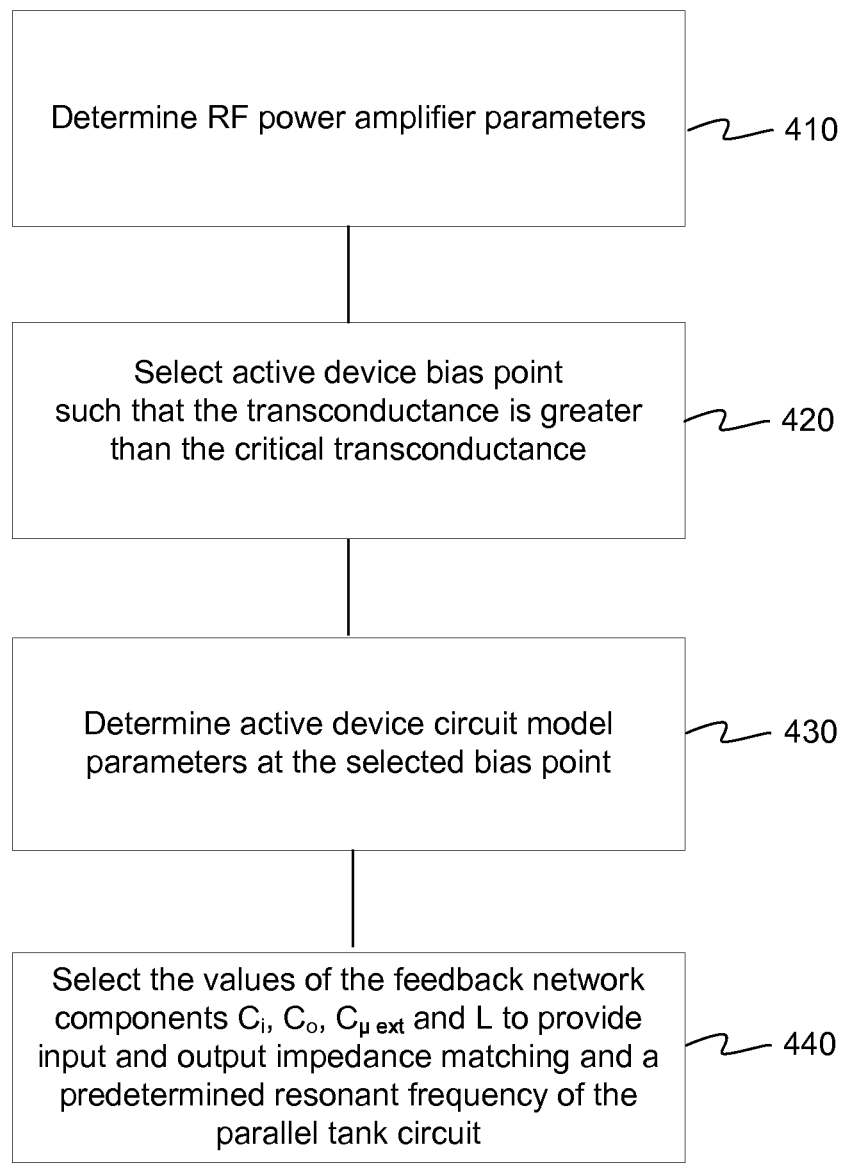
FIG. 4 shows a process for producing an RF power amplifier stage, in accordance with some implementations.

FIG. 4 depicts a process 400 for producing an RF power amplifier stage, in accordance with some example implementations.

At 410, a processor may determine, for the RF amplifier, one or more of the following amplifier parameters: a device technology (e.g., silicon-germanium, gallium-arsenide, etc), an active device structure (e.g., bipolar junction transistor, field-effect transistor, etc.), a quantity of power amplifier stages, an operating frequency, a gain, an output power, and any other parameters which may be determined or optimized by a processor. Some of these parameters may be dictated based on, for example, the intended application, such as a satellite communications application for a particular satellite. For example, an RF power amplifier for millimeter-wave satellite communications may require 200 milliwatts (23 dBm) of output power at 38 Gigahertz. In this example, the parameters which may be determined at 410 may thus include the device technology, active device structure, the quantity of stages, and the gain.

At 420, a bias point for the active device, such as active deice 195, may be selected, such that the active device's transconductance (which is determined by the bias point) is about greater than a critical transconductance value, as described above with respect to FIGS. 3A and 3B and Equation 5. For example, a processor may select a bias point representative of a transconductance value greater than the critical value given in Equation 5. The processor may select the bias point by selecting the bias voltage that corresponds to the selected transconductance. However, selecting a transconductance value below the critical value may result in poorer input and output matching and/or degraded linearity compared to the matching and linearity realized when the transconductance is above the critical value. The bias point may be implemented by setting a direct current (DC) base/source/input voltage.

At 430, the values of the components of a circuit model of the active device may be determined. For example, the values of the base-emitter capacitance $C_\pi$ 320, and the base-collector capacitance $C_\mu$ 315 may depend on the bias point of bipolar junction transistor 220B. The values of the base-emitter capacitance $C_\pi$ 320 and $C_\mu$ 315 may be determined after the bias point is determined.

At 440, the values of the components of the feedback network, such as feedback network 210 with components including input capacitance $C_i$ 230, output capacitance $C_o$ 250, inductance L 240, and feedback capacitance $C_{\mu\ ext}$ 255 may be chosen. The values of these components may be chosen to provide, when the active device transconductance 330 is substantially above the critical transconductance in accordance with Equation 5, a good input match at input port 260, a good output match at output port 270, and a parallel tank 310 with a predetermined resonant frequency, $\omega_o$. For example, a processor may select input capacitance $C_i$ 230, output capacitance $C_o$ 250, inductance L 240, feedback capacitance $C_{\mu\ ext}$ 255, and a bias point to provide a transconductance above the critical transconductance in accordance with Equation 5, and good input and output matching in accordance with Equation 2A. In the example of FIG. 2B, the feedback network includes the parallel tank including inductor L 240 in parallel with the series combination of input capacitance $C_i$ 230, base-collector capacitance $C_\mu$ 315 from the bipolar junction transistor small-signal circuit model, output capacitance $C_o$ 250, and feedback capacitance $C_{\mu\ ext}$ 255. In some implementations the predetermined resonant frequency of the parallel tank circuit is the center of the operating frequency of the RF power amplifier.

In some example implementations, process 400 may be repeated for each stage of a multistage RF power amplifier and/or repeated for an individual stage. In any case, process 400 may be repeated in order to optimize the determination of the active bias point and the feedback network.

Referring again to FIG. 3A, the large-signal behavior of RF power amplifier stage 300 in FIG. 3A may depend on the biasing of bipolar junction transistor 220B. With a selection of the transconductance $g_m$ to be above the critical transconductance in $g_{m,crit}$, Equation 5, the selection of inductor L 240, input capacitance $C_i$ 230, output capacitance $C_o$ 250, and feedback capacitance $C_{\mu\ ext}$ 255, the circuit in FIG. 3B may exhibit one or more of the following attributes at the resonant frequency of the parallel tank circuit 310:

1) The power delivered from the source to the input of amplifier stage 300, for example input power $P_i$ 130, may be maximized when the input impedance $Z_i$ 140 is equal to about the source impedance $Z_s$ 120, wherein the input power $P_i$ 130 may be expressed in terms of the input current $i_i$ and the characteristic impedance $Z_o$, or in terms of the input source voltage and characteristic impedance $Z_o$ according to the following equation $P_{in}=(i_i^2(\omega_o)\cdot Z_o)/(2)=(V_s^2)/(4Z_o)$;

2) The power delivered to the load is output power $P_o$ 170, wherein the output power 170 may be expressed in terms of the output current $i_o$ and the characteristic impedance $Z_o$, or in terms of the input current $i_i$, the voltage gain $A_v$ and the characteristic impedance $Z_o$ according to the following equation: $P_o=(i_o^2(\omega_o)\cdot Z_o)/(2)=(A_v^2\cdot i_i^2(\omega_o)\cdot Z_o/(2)$, wherein the source impedance $Z_s$ 120 is equal to the load impedance $Z_L$ 180, which are both equal to the characteristic impedance $Z_o$;

3) The transducer power gain $G_T$ may be represented as a ratio of the output power $P_{out}$ 170 delivered to the load to the input power available at the source $P_{in}$ 130 or as the voltage gain squared according to the following equation: $G_T=(P_{out})/(P_{in})=A_v^2$, which depends on the input capacitance $C_i$ 230, and base-collector capacitance, $C_\mu$ 315;

4) The collector efficiency $\eta$ may be represented as a ratio of the output power $P_{out}$ 170 to the direct current power supplied to the power amplifier $P_{dc}$ or in terms of the peak output current $i_o$, characteristic impedance $Z_o$, direct current collector bias voltage $V_{cc}$, and collector current $I_c$ according to the following equation:

$$\eta=(P_{out})/(P_{dc})=(i_o^2 Z_o)/(2V_{cc}I_c) \qquad \text{Equation 9; and}$$

5) The maximum collector efficiency may be expressed in terms of the voltage gain $A_v$ as follows:

$$\eta_{max} = \frac{A_v}{2(A_v + 1)}. \qquad \text{Equation 10}$$

While the efficiency, $\eta$, in Equation 9 may be influenced by the RF power amplifier class (a class A amplifier, a class B amplifier, a class AB amplifier, and the like), the RF power amplifier 150 may achieve, in some example implementations, higher efficiency at high input power levels because in part the load line matching does not require a high-Q impedance transformation. Instead of using separate input matching and output matching circuits, tank circuit 310 may provide both input and output matching.

Additionally, the base-emitter capacitance, $C_\pi$ 320, may substantially linearize the power amplifier input-output transfer function, which may provide for a higher input power before the output goes into compression. This linearization may be due to a voltage divider formed by input capacitor $C_i$ 230 and base-emitter capacitance $C_\pi$ 320, wherein input voltage $V_i$ is the input voltage at input port 260 and base-emitter voltage $V_\pi$ is the voltage between the base and emitter of bipolar junction transistor 220B. The voltage divider causes a portion of the input voltage $V_i$ to be across the input capacitor $C_i$ and the remaining portion of the input voltage $V_i$ to be across the base-emitter (equal to $V_\pi$) of bipolar junction transistor 220B. The base-emitter voltage $V_\pi$ may be represented in terms of a ratio involving the input capacitance $C_i$ 230 and the base-emitter capacitance $C_\pi$ 320 in Equation 11. With the base-collector capacitance $C_\mu$ 315 and feedback capacitance $C_{\mu\ ext}$ 255 in FIG. 3B being small compared to $C_i$ and $C_\pi$, they may be neglected in the representation of the voltage divider.

Figure 5A:
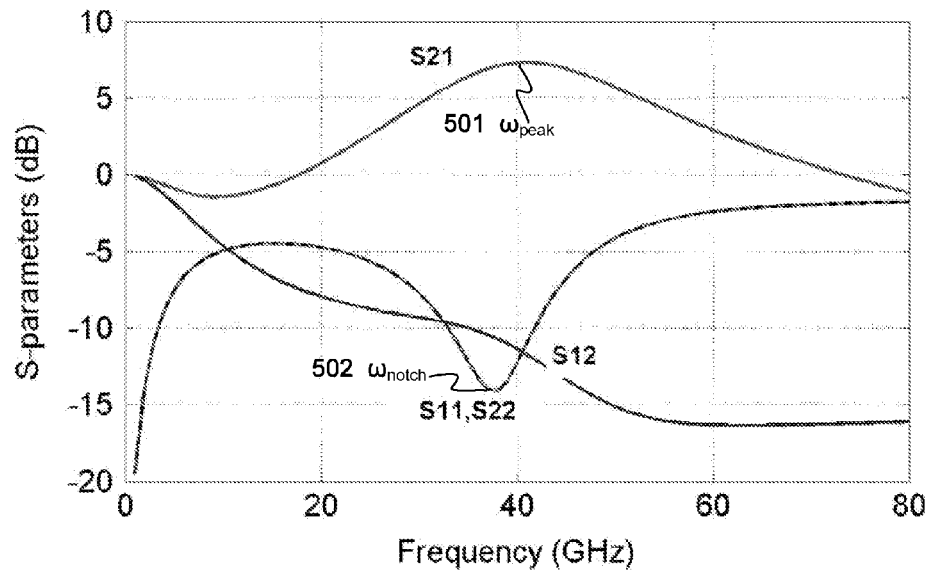
FIG. 5A shows the two-port S-parameters of a circuit similar to FIG. 2B.

FIG. 5A shows a two-port S-parameters of a circuit similar to FIG. 2B. Shown are the input match S11, the output match S22, the gain S21 and the reverse gain S12. The minimum of S11 and S22 at the notch frequency, $\omega_{notch}$ 502, related to Equations 3 and 6 is also shown. The maximum of S21 at the peak frequency, $\omega_{peak}$ 501, related to Equation 6 is also shown.

Figure 5B:
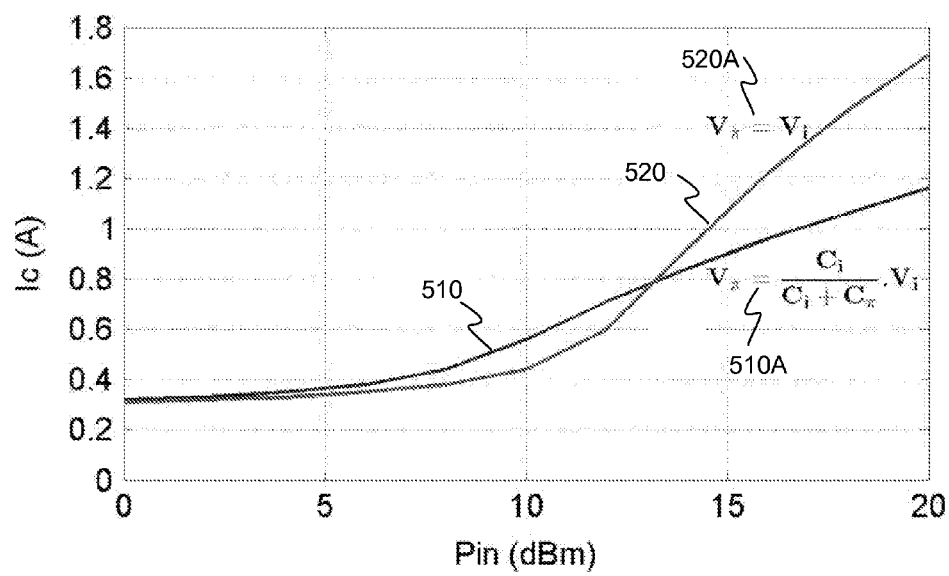
FIG. 5B shows the effect of the voltage divider created by capacitances, such as input capacitance Ci and base-emitter capacitance Cπ, on the collector current as a function of input power, in accordance with some implementations.

FIG. 5B shows the effect of the voltage divider. The voltage divider causes the RF power amplifier disclosed here to delay compression of the output signal at output port 270 to a higher power input signal at input port 260 compared to traditional design techniques.

The plot at 510 depicts the bipolar junction transistor collector current as a function of input power, in accordance with some example implementations. The voltage $V_\pi$ 510A at the base of the active device, such as bipolar junction transistor 220B, may be the result of the input voltage $V_i$ divided across input capacitance $C_i$ and base-emitter capacitance $C_\pi$ wherein, $$V_\pi = \frac{c_i}{c_i + c_\pi} V_i. \qquad \text{Equation 11}$$

In some example implementations, the effect of the voltage divider may be to linearize the transfer function of the output current as a function of input power. This may extend the range of input power before the output of the power amplifier goes into compression. For example, the effect of the voltage divider may be to increase the input power corresponding to the 1 dB compression point of the output 270. The voltage divider may, in some example implementations, improve the 1 dB compression point by a factor involving the ratio of the base-emitter capacitance to the input capacitance expressed as follows:

$$(1+(C_\pi)/(C_i)) \qquad \text{Equation 12.}$$

The plot at 520 depicts the input power versus the collector current without input capacitor $C_i$ and thus no voltage divider. Without input capacitor $C_i$, the voltage across the base-emitter $V_\pi$ 520A of the transistor is equal to the input voltage $V_i$. The result of not having the voltage divider is to produce more non-linearity in the input power versus collector current transfer function thus reducing the input power corresponding to the 1 dB compression point of the output.

Figure 6:
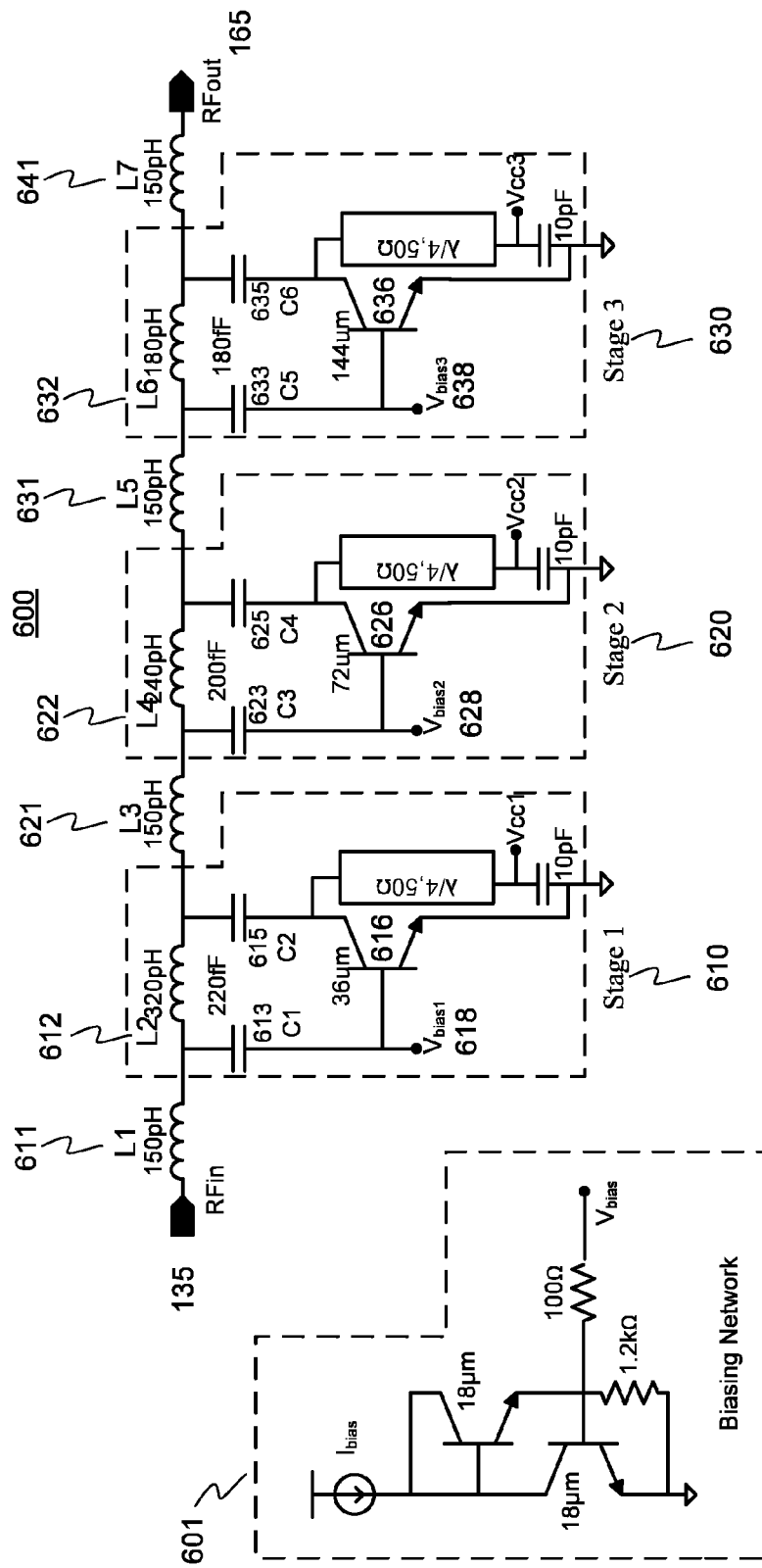
FIG. 6 is a circuit diagram showing a three-stage power amplifier, in accordance with some implementations.

FIG. 6 is a circuit diagram showing a three-stage power amplifier 600.

Stage 1 at 610 receives an input signal from input port 135 through inductor L1 611. The stage 1 parallel tank circuit includes inductor L2 612, capacitor C1 613, capacitor C2 615 and the base-collector capacitance ($C_\mu$) of bipolar junction transistor 616. Bipolar junction transistor 616 is biased at 618 by a bias network such as bias network 601. In the implementation shown in stage 1 610, inductor L1=150 pH (picohenries), inductor L2=320 pH, capacitors C1=C2=220 fF (femtofarads), and bipolar junction transistor 616 has a size of 36 microns.

Stage 2 at 620 receives an input signal from stage 1 through inductor L3 621. The stage 2 parallel tank circuit includes inductor L4 622, capacitor C3 623, capacitor C4 625 and the base-collector capacitance ($C_\mu$) of bipolar junction transistor 626. Bipolar junction transistor 626 is biased at 628 by a bias network such as bias network 601. In the implementation shown in stage 2 620, inductor L3=150 pH, inductor L4=240 pH, capacitors C3=C4=200 fF, and bipolar junction transistor 626 has a size of 72 microns.

Stage 3 at 620 receives an input signal from stage 2 through inductor L5 631. The stage 3 parallel tank circuit includes inductor L6 632, capacitor C5 633, capacitor C6 635 and the base-collector capacitance ($C_\mu$) of bipolar junction transistor 636. Bipolar junction transistor 636 is biased at 638 by a bias network such as bias network 601. In the implementation shown in stage 3 630, inductor L5=150 pH, inductor L6=180 pH, capacitors C5=C6=180 fF, and bipolar junction transistor 626 has a size of 144 microns.

Output port 165 provides the output of RF power amplifier 600 from stage 3 through inductor L7 641 which has a value of 150 pH. The component values in power amplifier 600 are representative of a particular implementation where the values a chosen in accordance with the foregoing disclosure. Any number of other implementations are also possible that satisfy the foregoing considerations.

Figure 7:
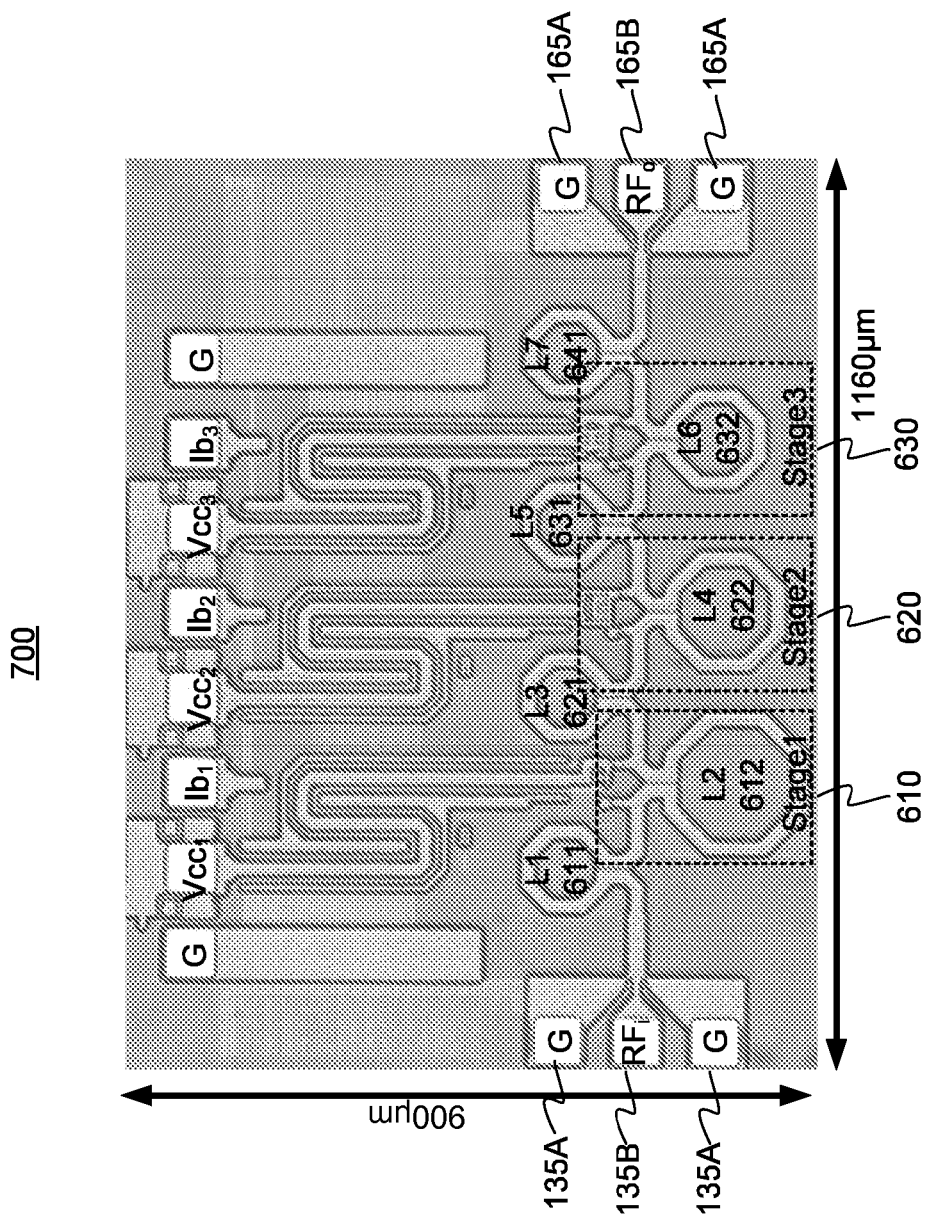
FIG. 7 is a photograph of a chip containing a three-stage power amplifier, in accordance with some implementations.

FIG. 7 shows a drawing 700 of a die containing a circuit similar to the circuit of FIG. 6 implemented using a 120 nm SiGe BiCMOS process. The circuit measures 1160 microns×900 microns. The implementation at 700 has three RF power amplifier stages 610, 620, and 630, which are similar in some respects to the three stages at FIG. 6.

The input port to the RF power amplifier in 700 is a coplanar waveguide ground-signal-ground structure shown in 135A and 135B. The physical inductors of FIG. 6 are depicted as inductors L1 611, L2 612, L3 621, L4 622, L5 631, L6 632 and L7 641. The power amplifier output port is depicted at 165A and 165B. Capacitors C1 613, C2 615, C3 623, C4 625, C5 633, and C6 635 are also present but not labeled as are bipolar junction transistors 616, 626, and 636.

The nominal collector current bias for all three stages is 4 mA at 2.4-V collector voltage. This RF power amplifier built in accordance with the foregoing may, in some example implementations, achieve a maximum power added efficiency of 20% with a saturated output power of 21.1 dBm; a saturated output power of 23 dBm with a collector voltage of 3 V; and/or a 3-dB bandwidth of 5-GHz from 36 to 41 GHz, although other implementations may realize other performance values as well.

The invention claimed is:

1. An apparatus comprising:
   a first transmission line carrying a signal to an input port of a power amplifier, the power amplifier producing an output signal at an output port, the power amplifier comprising an amplifier stage further comprising:
   an active device, and
   a feedback network comprising one or more reactive elements configured to resonate at a predetermined frequency, to provide a first impedance match at an input to the amplifier stage, and to provide a second impedance match at an output of the amplifier stage, the first impedance match and the second impedance match configured by at least biasing the active device to produce a transconductance at least one of equal to or greater than a critical transconductance.

2. The apparatus of claim 1, wherein the power amplifier comprises a plurality of amplifier stages.

3. The apparatus of claim 1, wherein critical transconductance is determined based on the following equation:

$$g_{m,crit} = \frac{C_i}{C_{eff} Z_o}$$

wherein Ci is an input capacitance, Ceff is an effective capacitance, and Zo is a characteristic impedance.

4. The apparatus of claim 1, wherein the active device is at least one of a bipolar junction transistor, a field effect transistor, a metal oxide semiconductor field effect transistor, a metal semiconductor field effect transistor, and a high electron mobility transistor.

5. A method comprising:
   determining a bias point for an active device in a radio frequency power amplifier, wherein the bias point is selected to cause a transconductance of the active device to be above a critical transconductance value;
   determining a parasitic capacitance between an input of the active device and an output of the active device;

selecting one or more reactive components in a feedback circuit of the radio frequency power amplifier to produce a parallel tank circuit, the one or more reactive components including the parasitic capacitance; and determining one or more values for the one or more reactive components in the parallel tank circuit to cause an input impedance match and an output impedance match.

6. The method of claim 5, wherein the active device is a bipolar junction transistor.

7. The method of claim 6, wherein the feedback network comprises:

an inductor connected between an input port and an output port;

an input capacitor connected between the input port and a base of the transistor;

a parasitic capacitance of the transistor between the base of the transistor and a collector of the transistor; and an output capacitor connected between the output port and the collector of the transistor.

8. The method of claim 6, wherein the feedback network further comprises:

a feedback capacitor in parallel with the parasitic capacitance between the base and the collector of the transistor.

9. The method of claim 6, wherein the feedback network further comprises:

a parasitic capacitance of the transistor between the base of the transistor and the emitter of the transistor.

10. A non-transitory computer readable medium comprising program code which when executed by a processor provide operations comprising:

determining a bias point for an active device in a radio frequency power amplifier, wherein the bias point is selected to cause a transconductance of the active device to be above a critical transconductance value;

determining a parasitic capacitance between an input of the active device and an output of the active device;

selecting one or more reactive components in a feedback circuit of the radio frequency power amplifier to produce a parallel tank circuit, the one or more reactive components including the parasitic capacitance; and determining one or more values for the one or more reactive components in the parallel tank circuit to cause an input impedance match and an output impedance match.

11. The non-transitory computer readable medium of claim 10, wherein the active device is a bipolar junction transistor.

12. The non-transitory computer readable medium of claim 11, wherein the feedback network comprises:

an inductor connected between an input port and an output port;

an input capacitor connected between the input port and a base of the transistor;

a parasitic capacitance of the transistor between the base of the transistor and a collector of the transistor; and an output capacitor connected between the output port and the collector of the transistor.

13. The non-transitory computer readable medium of claim 12, wherein the feedback network further comprises:

a feedback capacitor in parallel with the parasitic capacitance between the base and the collector of the transistor.

14. The non-transitory computer readable medium of claim 12, wherein the feedback network further comprises:

a parasitic capacitance of the transistor between the base of the transistor and the emitter of the transistor.

\* \* \* \* \*